US006654292B2

(12) United States Patent
Keays

(10) Patent No.: US 6,654,292 B2
(45) Date of Patent: Nov. 25, 2003

(54) NON-VOLATILE MEMORY WITH BLOCK ERASE

(75) Inventor: Brady L. Keays, Half Moon Bay, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/298,737

(22) Filed: Nov. 18, 2002

(65) Prior Publication Data

US 2003/0072179 A1 Apr. 17, 2003

Related U.S. Application Data

(62) Division of application No. 09/939,394, filed on Aug. 24, 2001.

(51) Int. Cl.[7] .................. G11C 16/04; G11C 16/06; G11C 14/00; G11C 7/00; G11C 8/00
(52) U.S. Cl. .................. 365/185.33; 365/185.29; 365/185.3; 365/185.25; 365/185.23; 365/185.19; 365/185.11; 365/185.08; 365/189.04; 365/218; 365/230.03; 365/230.08; 365/236; 365/238.5
(58) Field of Search ................ 365/185.33, 185.29, 365/185.3, 185.25, 185.23, 185.19, 185.11, 185.08, 189.04, 218, 230.03, 230.08, 236, 238.5

(56) References Cited

U.S. PATENT DOCUMENTS

| 5,241,507 A | | 8/1993 | Fong |
| 5,412,793 A | * | 5/1995 | Kreifels et al. .............. 711/101 |
| 5,448,712 A | * | 9/1995 | Kynett et al. ................ 711/103 |
| 5,491,809 A | * | 2/1996 | Coffman et al. ............. 711/103 |
| 5,568,426 A | | 10/1996 | Roohparvar et al. |
| 5,675,540 A | | 10/1997 | Roohparvar |
| 5,677,879 A | | 10/1997 | Roohparvar et al. |
| 5,901,089 A | | 5/1999 | Korsch et al. |
| 6,052,310 A | * | 4/2000 | Sunkavalli ............. 365/185.29 |
| 6,163,479 A | | 12/2000 | Chevallier |
| 6,172,914 B1 | * | 1/2001 | Haddad et al. ........ 365/185.29 |
| 6,222,770 B1 | | 4/2001 | Roohparvar |
| 6,243,839 B1 | | 6/2001 | Roohparvar |
| 6,282,145 B1 | | 8/2001 | Tran et al. |
| 6,381,174 B1 | * | 4/2002 | Roohparvar et al. ... 365/185.09 |
| 6,381,670 B1 | | 4/2002 | Lee et al. |
| 6,493,280 B2 | * | 12/2002 | Mihnea et al. .............. 365/218 |

* cited by examiner

Primary Examiner—David Nelms
Assistant Examiner—Ly Duy Pham
(74) Attorney, Agent, or Firm—Leffert Jay & Polglaze, P.A.

(57) ABSTRACT

A method and apparatus for erase operations of a flash memory block. In one embodiment, a method comprises erasing a predetermined percent of rows in a memory block, analyzing a number of erase pulses used to erase the predetermined percent and calculating an acceptable number of additional erase pulses which could be applied to the memory block to erase the remaining rows. In another embodiment, a flash memory device comprises a memory array, a controller and a register. The memory array has a plurality of blocks of flash memory cells. The memory cells in each block are arranged in rows. The controller is used to control memory operations to the memory array and the register is coupled to the controller to track the erase status of each row of memory cells.

5 Claims, 7 Drawing Sheets

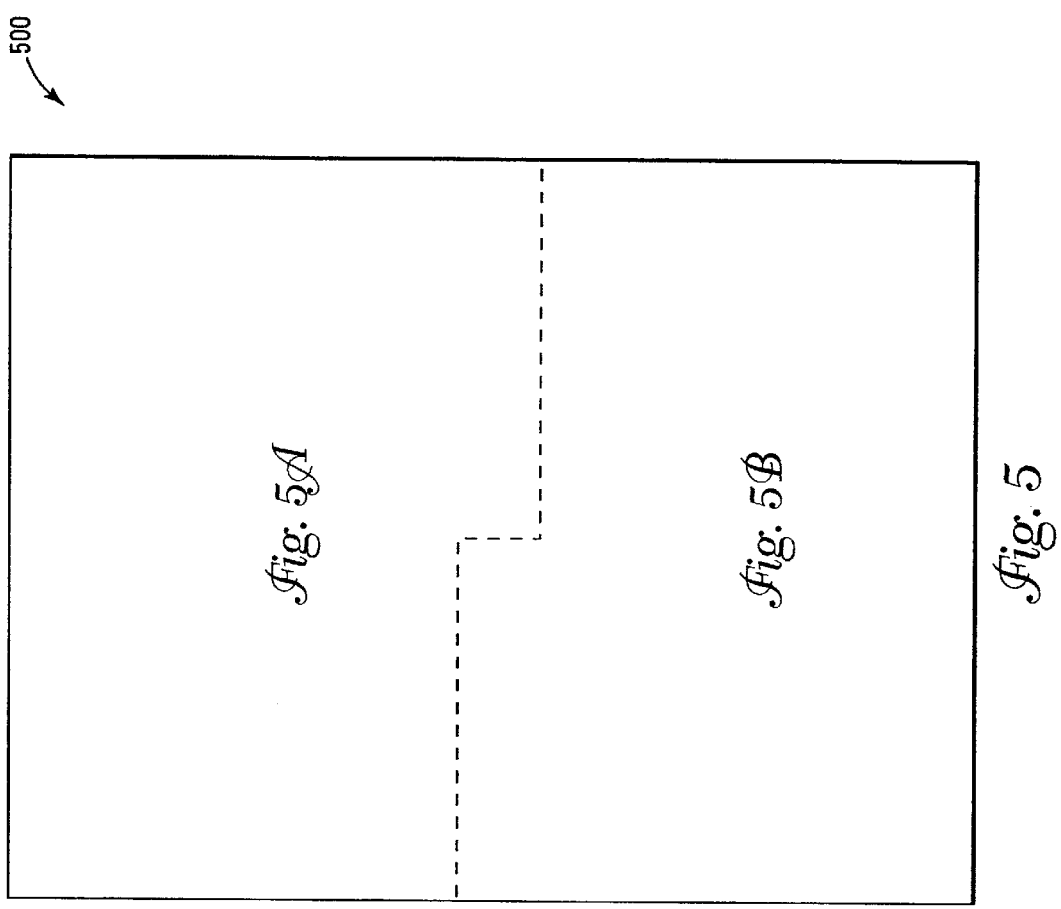

NON-VOLATILE MEMORY WITH BLOCK ERASE

This is a divisional application of U.S. Ser. No. 09/939,394, filed Aug. 24, 2001.

TECHNICAL FIELD OF THE INVENTION

The present invention relates generally to non-volatile memories and in particular the present invention relates to erase operations in a flash memory device.

BACKGROUND OF THE INVENTION

Memory devices are typically provided as internal storage areas in the computer. There are several different types of memory. One type of memory is random access memory (RAM). RAM has traditionally been used as main memory in a computer environment. Most RAM is volatile, which means that it requires periodic refresh of electricity to maintain its contents. Yet another type memory is a flash memory. A flash memory is a type of memory that is non-volatile. That is, flash memory is a type of memory that retains data even without a periodic refresh of electricity. Flash memory has many applications. For example, many modern computers have their basic I/O system bios stored on a flash memory chip, so that it can be easily updated if necessary. Moreover, some digital systems have replaced conventional mass storage devices with flash memory devices. Specifically, some conventional hard drives in personal computers have been replaced with flash memory.

A typical flash memory comprises a memory array that is separated into blocks of memory cells (cells). Each block of cells is arranged in a row and column fashion. Each cell includes a floating gate field-effect transistor capable of holding a charge. Each cell can be electrically programmed in a random basis by charging the floating gate. The charge can be removed from the floating gate by an erase operation. Thus, the data in a cell is determined by the presence or absence of the charge in the floating gate.

The state of a Flash memory cell is read or verified using a reference cell current. That is, a reference non-volatile memory cell is coupled to a sense amplifier circuit via a reference bit line. The cell to be verified is also coupled to the sense amplifier circuit via a second bit line. A differential current between the bit lines is detected, and the programmed state of the cell is determined. For example, the reference cell may be programmed to an intermediate state such that it conducts about half the current conducted by a fully programmed memory cell, such that if the cell to be read is programmed, it conducts more current than the reference memory cell, and if the cell to be read is erased, it conducts less current than the reference cell.

To program a memory cell, a high positive voltage such as 12 volts is applied to the control gate of the cell. In addition, a moderate positive voltage such as 6 to 9 volts is applied to the drain while a source voltage and a substrate voltage are at ground level. These conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to increase the effective threshold voltage of the cell as compared to a cell that has not been programmed.

In flash memories, cells are erased in blocks. This is achieved by putting a negative voltage such as −10 to −17 volts on word lines coupled to the control gates of all the cells in a block of cells and coupling the source connection of the block to a Vcc (power supply) such as 5 volts, or higher for a period of time. This is usually done as a pulse or a series of pulses. Each pulse creates a field that removes electrons from the floating gates of the memory elements. The speed in which a cell is erased, i.e. the number of pulses needed to erase the cell, is dependant on many varying conditions including voltage level of pulses, length of pulses and temperature. It is common to have a flash memory block in which individual memory cells erase at different rates. In this situation, typically the slowest bit in the block dictates the level of erasure of all the cells in the block. This can cause the other cells in the block to become over-erased. If, for example, a typical memory cells require 10 pulses to erase and the slowest memory cell in an erasable block requires 30 pulses to erase, in erasing the slowest cells, the typical cells are subject to an extra 20 erase pulses that could potentially cause them to become over-erased.

An over-erased cell is a cell that has been erased past a certain point. An over-erased cell becomes depleted. That is, too many electrons are removed from the floating gate, causing a floating gate voltage to become more positive than the threshold of the cell. The cell, therefore, cannot be turned off, even if the control gate is at a ground potential. Moreover, an over-erased cell can cause all memory cells coupled to the same column to be read as erased cells, even though they may be programmed.

To limit the amount of over-erased cells in a block of flash memory, an erase operation comprising a pre-program cycle, an erase cycle, and a soft program cycle, is generally performed. During a pre-program cycle, all the cells in a block are first programmed above a predetermined level. This is done so that the floating gates of all the cells in the block start out with approximately the same amount of charge. The erase cycle then applies an erase pulse to the block and verifies each cell row by row to determine if all the cells are in an erased state. The erase cycle is repeated until all the cells have been verified as being erased. The soft programming cycle, or, as it is sometimes referred to, the voltage (Vt) distribution cycle, then checks each column (bit line) in the block for current levels that would indicate if an over-erased cell is coupled to the bit line. If an over-erased cell is detected in a bit line, a soft program (soft programming pulse) is systematically applied to the control gates of the cells coupled to the bit line until the current can no longer be detected.

Although a soft program cycle can be used to recover over-erased cells, it is however, desired to reduce the number of over-erased cells before a soft program cycle is applied, because some cells that are over-erased cannot be recovered. Moreover, the integrity of cells that are over-erased and recovered can be diminished with each over-erasure.

For the reasons stated above, and for other reasons stated below which will become apparent to those skilled in the art upon reading and understanding the present specification, there is a need in the art for a flash memory with an improved process for erasing a block of flash memory having a small number of cells that are slow to erase as compared to other cells in the block.

SUMMARY OF THE INVENTION

The above-mentioned problems with non-volatile memory devices and other problems are addressed by the present invention, and will be understood by reading and studying the following specification.

In one embodiment, a method of operating a flash memory is disclosed. The method comprising, erasing a predetermined percent of rows in a memory block, analyzing a number of erase pulses used to erase the predetermined percent and calculating an acceptable number of additional erase pulses which could be applied to the memory block.

In another embodiment, a method of operating a flash memory is disclosed. The method comprising, applying at least one erase pulse to the block, wherein the block has a plurality of memory cells arranged in rows, verifying each row to determine if the memory cells associated with each row are erased after each erase pulse and completing erase of the block when a predetermined number of rows in the block have been verified as being erased, wherein the predetermined number of rows is less than the total number of rows in the block.

In another embodiment, a method of operating a non-volatile memory is disclosed. The method comprising, applying at least one erase pulse to a block of flash memory cells, wherein the block of memory cells is arranged in rows, verifying if each row is erased in the block after each erase pulse is applied, counting the number of erase pulses used to verify a predetermined number of rows have been erased in the block and applying a predetermined number of erase pulses to the block to try to erase the rows that have not been verified as being erased, wherein the predetermined number of erase pulses is a fraction of the number of erase pulses used to verify the predetermined number of rows.

In another embodiment, a method of performing an erase operation on a flash memory block is disclosed. The method comprising, pre-charging flash memory cells arranged in rows in the block to a predetermined level, applying at least one first stage erase pulse to the block, verifying if each memory cell is erased by row after each first stage erase pulse is applied to the block, counting a first number of pulses applied to the block, wherein the first number of pulses applied to the block is the number of pulses used to verify a majority of rows in the block have been erased, calculating a second number based on a fraction of the first number, wherein the second number is a maximum number of additional second stage erase pulses that may be applied to the block to try and erase the memory cells in the rows not yet verified as being erased, applying at least one second stage erase pulse to the block, verifying if each memory cell is erased by row after each second stage erase pulse is applied to the block and completing erase of the block when either the second number of second stage erase pulses have been applied to the block or all the rows have been verified as being erased.

In another embodiment, a flash memory device comprises a memory array, a controller and a register. The memory array has a plurality of blocks of flash memory cells. The memory cells in each block are arranged in rows. The controller is used to control memory operations to the memory array and the register is coupled to the controller to track the erase status of each row of memory cells.

In another embodiment, a non-volatile memory device comprises a plurality of memory arrays, a controller and a register array. Each memory array has a plurality of blocks of flash memory cells. Moreover, the flash memory cells in each block are arranged in rows. The controller is used to control memory operations to the memory arrays. The controller stores data in the register array to track rows of memory cells in blocks verified as being erased.

In another embodiment, a flash memory device comprises, a memory array and a control circuit. The memory array has a plurality of erasable blocks of memory cells. The memory cells in each block are arranged in rows. The control circuit is used to control memory operations to the memory array. Specifically, the control circuit applies a first number of erase pulses to a block being erased in a first stage and a second number of erase pulses to the block in a second stage. The number of erase pulses applied in the second stage is based on the number of erase pulses needed in the first stage to verify a predetermined number of rows in the block have been erased.

In yet another embodiment, a flash memory system comprises, a processor, a plurality of memory arrays, a controller and a plurality of registers. The processor is used to provide external erase commands. Each memory array has a plurality of erasable blocks of flash memory cells. The memory cells in each block are arranged in rows. The controller is used to receive the external erase commands from the processor. Moreover, the controller performs erase operations on the blocks of memory cells in the plurality of memory arrays. The plurality of registers are coupled to the controller to track rows of memory cells verified as being erased. Each register is associated with, one of the memory arrays. In addition, each register has a plurality of register sub-blocks. Each register sub-block is associated with a block of memory cells. Moreover, each sub-block has a register memory cell for each row in its associated block of memory cells.

DETAILED DESCRIPTION OF THE INVENTION

In the following detailed description of the preferred embodiments, reference is made to the accompanying drawings, which form a part hereof, and in which is shown by-way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
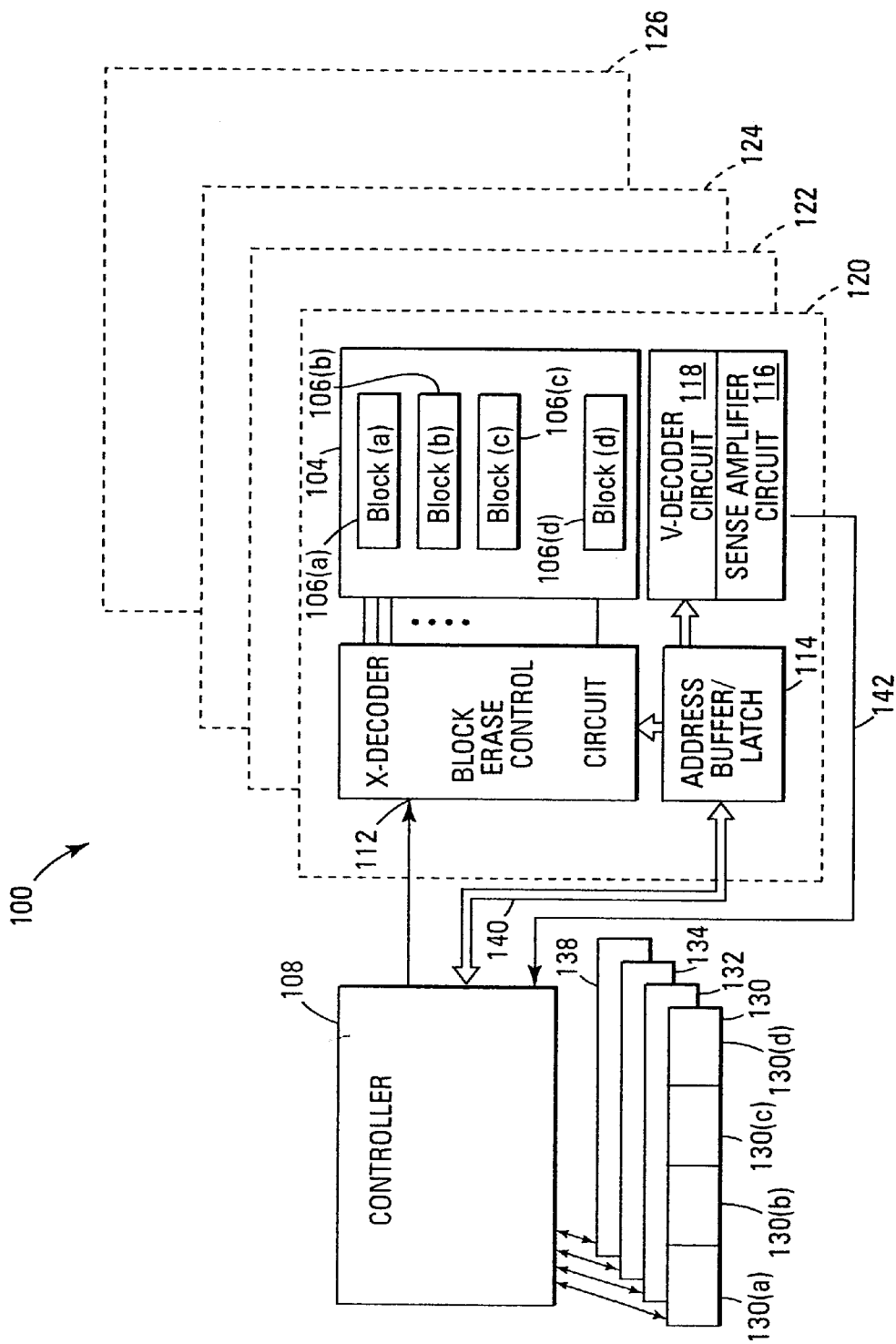
FIG. 1 is a block diagram of a memory device of an embodiment of the present invention.

Referring to FIG. 1, a block diagram of one embodiment of a mass storage flash memory 100 of the present invention is illustrated. The diagram is simplified to show those elements relevant to understanding the present invention. The mass storage flash memory 100 includes a flash memory 120. As illustrated, the flash memory 120 has an array 104 of non-volatile memory cells. The array 104 is arranged in a plurality of addressable blocks 106(a–d). Although only four addressable blocks 106(a–d) are shown, it will be appreciated in the art that a flash array may be divided up into more or less addressable blocks or sub-blocks and the present invention is not limited to four addressable blocks per flash memory device. The flash memory device 120 is also illustrated as having an x-decoder/block erase control circuit and a y-decoder circuit. A sense amplifier circuit 116 is provided to read or verify an addressed cell. An address buffer/latch 114 is used to receive address requests and is coupled to the x-decoder circuit/block erase control 112 and the y-decoder circuit 118. Moreover, although in this embodiment the mass storage flash memory 100 is illustrated as having four Flash memories 120, 122, 124 and 126, it will be appreciated in the art that the number of flash memories could very depending on the storage capacity desired and the present invention is not limited to four flash memories per mass storage flash memory.

As FIG. 1 also illustrates, the mass storage flash memory 100 has a controller 108. The controller 108 is used to control memory operations (i.e. program, erase and read operations) of the flash memory arrays on the flash memories 120, 122, 124 and 126. For example, regarding flash memory 120, the controller 108 is coupled to the address buffer/latch 114 by address line 140 to provide address requests. The controller 108 is further coupled to the sense amplifier circuit 116 via data line 142 to provide the controller with the results of a cell that is read or verified. The controller 108 is further coupled to the x decoder/block erase control circuit 112 to control erase operations on the memory array 104. Although not shown, each flash memory 122, 124 and 126 has the same elements as flash memory 120. Moreover, the elements of flash memories 122, 124 and 126 are all coupled to the controller 108 in the same manner as the controller 108 is coupled to flash memory 120. Therefore, the controller 108 controls each flash memory 120, 122, 124 and 126.

Referring to FIG. 1, four registers 130, 132, 134 and 138 are illustrated. Each register is associated with a respective flash memory array of a flash memory 120, 122, 124 and 126. For example, register 130 is associated with flash memory array 104 on flash memory 120. In this embodiment, register 130 is positioned outside of a die containing flash memory 120. Likewise, registers 132, 134 and 138 are respectfully positioned outside flash memories 122, 124 and 126. Each register 130, 132, 134 and 138 is further separated into register sub-blocks. For example, register 130 contains the register sub-blocks 130(a), 130(b), 130(c) and 130(d). Each register sub-block is associated with a block of cells in a flash memory array. For example, register sub-block 130(a) is associated with block 106(a) of flash memory array 104, register sub-block 130(b) is associated with block 106(b) of flash memory array 104, register sub-block 130(c) is associated with block 106(c) of flash memory array 104 and register sub-block 130(d) is associated with block 106(d) of flash memory array 104. Although four registers having four register sub-blocks are described, it will be understood in the art that the number of registers and register sub-blocks will vary with the number of flash memory arrays used and the number of blocks in each flash memory array and the present invention is not limited to four registers having four register sub-blocks.

The registers 130, 132, 134 and 138 can be referred to as a register array. Each register sub-block contains a plurality of register memory cells, or tracking memory cells, to store data that indicates if an associated row in an associated block of memory has been verified as being erased. That is, each row of cells in a block of cells has an associated register memory cell in a register sub-block to track or flag when the row has been erased. For example, for a block of memory having 128 rows, an associated register sub-block will have 128 register memory cells to track the program state of each row. In one embodiment of the present invention, the register memory cells in the register array are volatile memory cells, such as RAM memory cells. In another embodiment, the register memory cells in the register array are non-volatile memory cells, such as flash memory cells.

As stated above, the controller 108 controls erase operations of each flash memory array. In one embodiment, after an erase pulse is applied to a block to be erased, the controller 108 verifies each row in the block. If a row is verified as being erased, the controller 108 flags an associated register memory cell in an associated register sub-block. Besides tracking which rows have been verified as being erased, the controller also tracks the number of rows that have been verified. If a predetermined number of rows have not been verified after an erase pulse, a further erase pulse is applied to the block. This process is repeated until the controller 108 verifies that the predetermined number of rows are erased. Rows not verified as being erased are not used during subsequent memory operations. Although, a number of rows in each block may be unused in this embodiment, the risk of over-erasing cells is reduced because the number of erase pulses applied to the block will not be controlled by the slowest cells or bits in the block of cells being erased. The predetermined number of rows is generally a majority of the rows and is selected by the manufacture of the memory and takes into consideration statistical data regarding how many rows could be expected to contain slow bits in an average flash memory block. For example, if the total amount of rows was 128 and it would be expected that three rows might contain slow bits, the predetermined amount of rows for this block would be 125.

In another embodiment, the controller 108 attempts to erase the cells in the rows that have not been verified. In this embodiment, the controller keeps track of the number of pulses used in getting the predetermined amount of rows verified as erased rows. The controller 108 then applies this number to an equation to calculate the maximum number of additional pulses that may be used to try and erase the remaining slow bits while minimizing the-risk of over-erasing other cells in the block. This embodiment takes into consideration the likely hood that additional erase pulses would over-erase a majority of the cells in trying to erase slow bits.

In one embodiment, the equation $N2=(A*N1)+B$ is used to determine the maximum number of erase pulses that should be used in trying to erase the slow bits. Wherein, N2 is maximum number of erase pulses, N1 is the number of erase pulses used erasing the predetermined number of rows in the block, A is a predetermined fraction and B is a minimum number of pulses to use in trying to erase the slow bits. A and B are generally set by the manufacture after testing the memory. Referring to the equation in this embodiment, as N2 is increased, N1 is increased. Therefore, if it takes a lot of pulses to reach the predetermined amount of rows verified as being erased rows, more pulse could be applied in trying to erase the slow cells in the unverified rows because the additional pulses are less likely to over-erase the already erased cells in the block. On the other hand, if it takes only a few pulses to reach the predetermined amount of rows verified as erased, a lesser amount of pulses would be applied in trying to erase the slow cells in the unverified rows because each pulse is more likely to over-erase the already erased cells. An erase algorithm incorporating the aforementioned is described in greater detail further below.

In this embodiment, if after N2 pulses have been applied, some of the rows are still not verified as being erased, the controller 108 ignores the unverified rows during subsequent memory operations (i.e. program and read operations) to the memory array. In one embodiment, the controller 108 does this by reading the memory cells in associated registers. If the controller 108 reads a memory cell that has not been flagged or programmed as being erased, the controller 108 skips over the row associated with the memory cell during the subsequent memory operation. In this embodiment, memory cells associated with rows that have not been verified as being erased are labeled as unverified rows.

Figure 2:
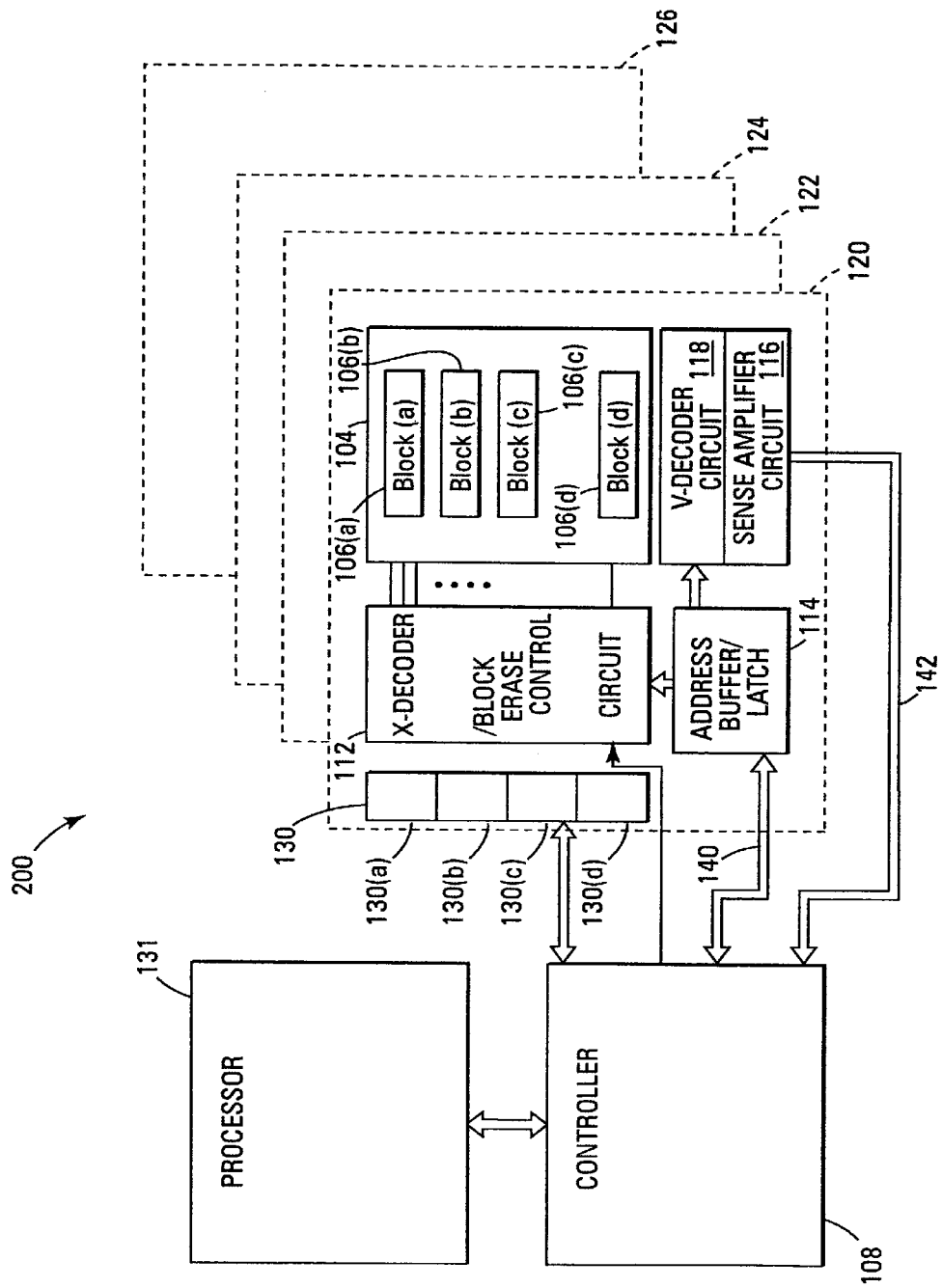
FIG. 2 is a block diagram of a memory system of one embodiment of the present invention.

Referring to FIG. 2, another embodiment of a mass storage flash memory 200 of the present invention is illustrated. In this embodiment, each register is internal to a die containing an associated flash memory to store the data that indicates if an associated row in an associated block of memory in a flash memory array has been verified as being erased. As illustrated in FIG. 2, register 130 is located in flash memory 120. Although not shown, flash memories 122, 124 and 128 also have an associated register. The controller 108 is coupled to each register of the mass storage memory 200 to store and retrieve data regarding the erased state of an associated row. FIG. 2 also illustrates a processor 131 coupled to the controller 130 for operation and testing of the mass storage memory 200.

Figure 3:
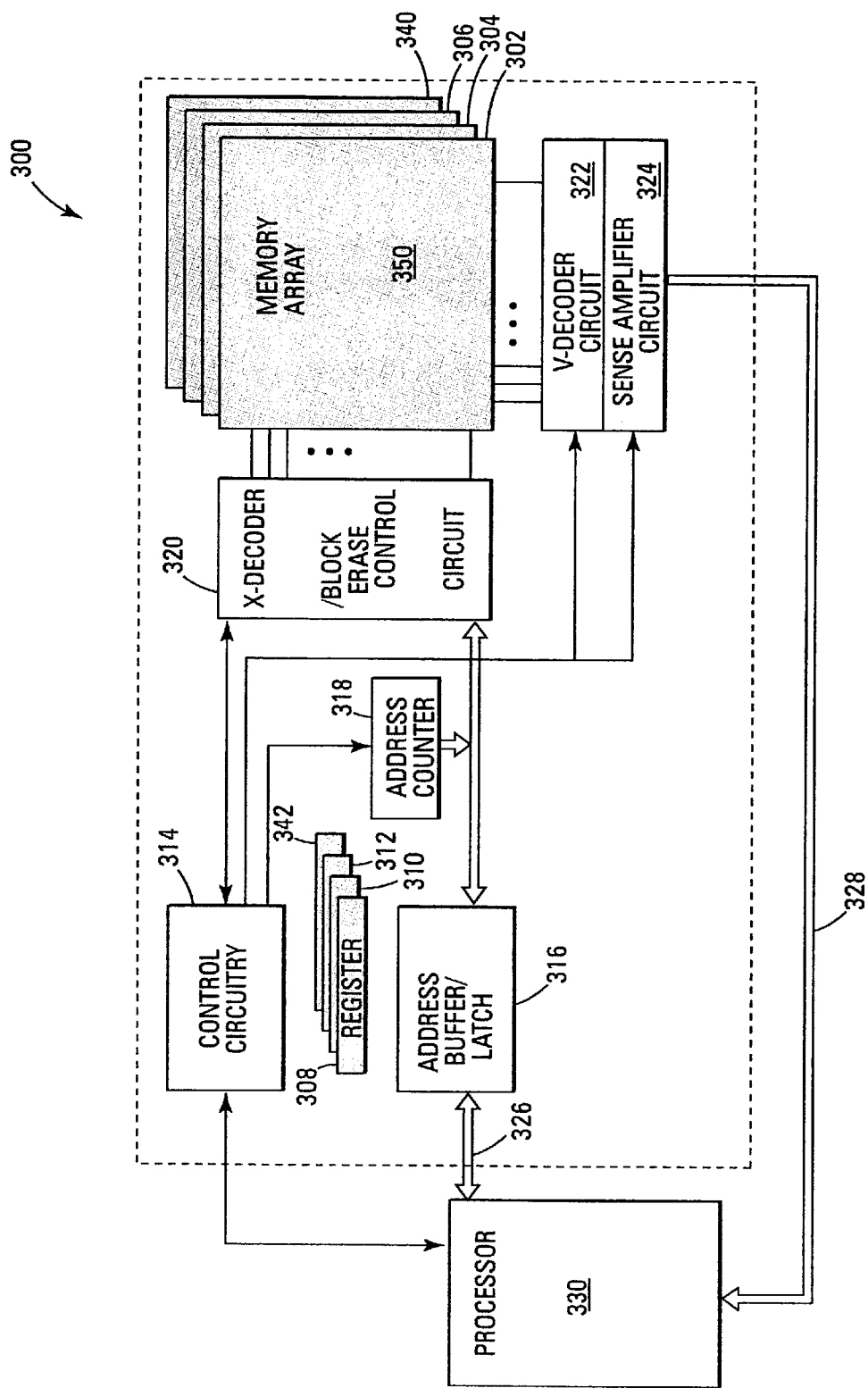
FIG. 3 is a block diagram of a memory device of one embodiment of the present invention.

Although it may be desired to apply the current invention to a mass storage flash memory, as described above, because a mass storage flash memory may have a significant amount of unused storage space, the present invention could also be applied to a typical flash memory system. Referring to FIG. 3, another embodiment of the present invention is illustrated incorporating a typical flash memory 300. The flash memory 300 has a memory array 350. The memory array 350 is shown having four banks 302, 304, 306 and 340. Each bank 302, 304, 306 and 340 contains erasable blocks of memory cells (not shown). Moreover, in one embodiment each block is further arranged in erasable sub-blocks. For example, a 16 Meg memory array can be arranged in four erasable blocks of 4 Meg where each of these blocks contains 16 sub-blocks. Although the memory array is illustrated as only having four banks, it will be appreciated in the art that more or less banks could be used and the present invention is not limited to four banks.

As illustrated, the flash memory 300 also has an x-decoder/block erase control circuit 320 to address selected rows and control block erase operations. A y-decoder 322 is provided to address selected columns. A sense amplifier circuit 324 is also provided to read or verify addressed cells. The flash memory 300 further has control circuitry 314 to control operations, i.e. read, program and erase operations, to the memory array 350. The control circuitry 314 can also be referred to as controller or a state machine. A processor 330 is coupled to the control circuitry 314 for testing and operation. The flash memory 300 is also shown having an address buffer/latch 316 and an address counter 318.

In this embodiment, registers 308, 310, 312, 342 are coupled to the control circuitry 314 to track erased rows in the memory array 350. Each register is associated with a bank in the memory array 350. For example, register 308 is associated with bank 302, register 310 is associated with bank 310, register 312 is associated with bank 306 and register 342 is associated with bank 340. Although not shown, each register has a register sub-block associated with each block of memory that contains a plurality of memory cells to store data that indicates if an associated row in an associated block of memory has been verified as being erased. Registers 308, 310, 312, 342 are implemented as described in the previous embodiments. To better understand the slow bit erase algorithm of the present invention, an algorithm of the prior art is first discussed.

Figure 4:
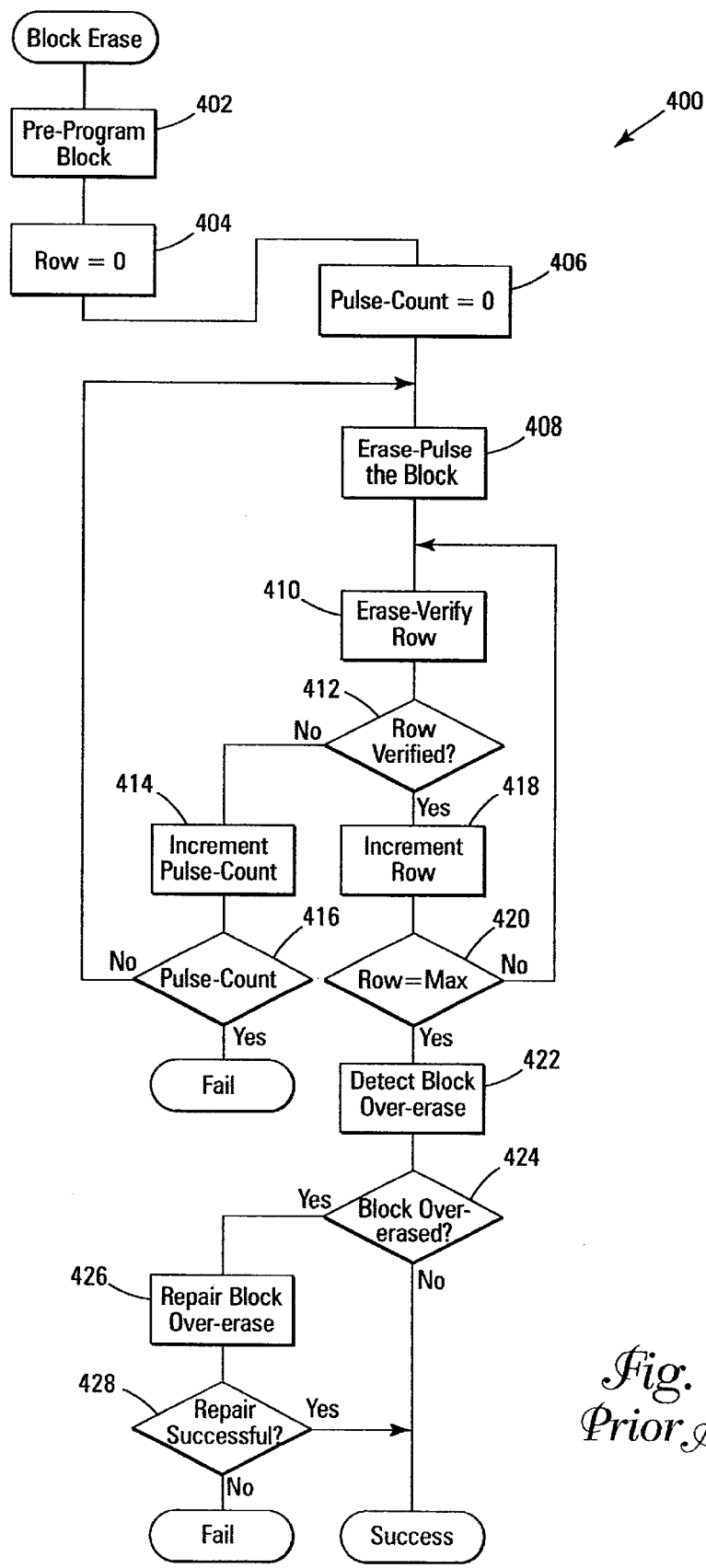
FIG. 4 is a flow chart illustrating a block erase in the prior art.

Referring to FIG. 4, a flow chart of a block erase algorithm 400 of the prior art is illustrated. As illustrated, in the prior art, a block erase algorithm 400 is started by pre-programming the cells in the block to a predetermined level (402). The row address and pulse count are then both set to zero (404, 406). An erase pulse is then applied to the block (408). Each cell in a row is read (410). The row is then verified as being erased (412).

If the row is not verified as being erased (410), the pulse count is incremented (414). The pulse count is then verified to see if it has reached a maximum predetermined number (416). If it is verified that the pulse count has reached the maximum number of pulses (416), erase of the block has failed. If it is verified that the pulse count has not reached a maximum number of pulses (416), another erase pulse is applied to the block (408) and the algorithm continues.

If a row is verified as being erased (412), the row is incremented (418). The row count is then verified to see if it is at a maximum (420). If the row count is not at a maximum (420), each cell of the row is read (410) and the algorithm continues. If the row is verified as being at a maximum (420), each column of the block is checked for a current indicating an over-erased cell is coupled thereon (422). The block is then verified for over-erased cells (424).

If the block has no over erased cells (424), the block erase was successful. If there are over-erased cells (424), a repair of the block is attempted with a soft program to recover the over-erased cells (426). An outcome of the repair is then verified (428). If the repair is not verified has being successful (428), the block will have over-erased cells. If the repair is verified as being successful (428), the block erase was a success.

Figure 5A:
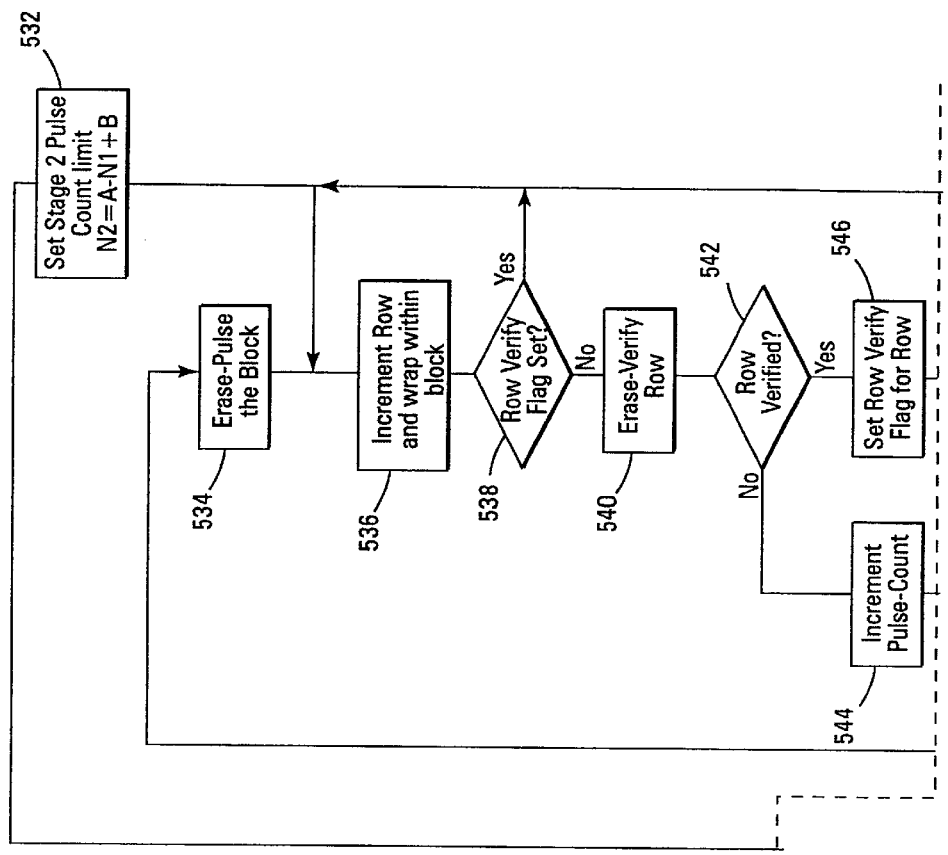
FIG. 5 is a flow chart of a block erase of one embodiment of the present invention.
Figure 5A:
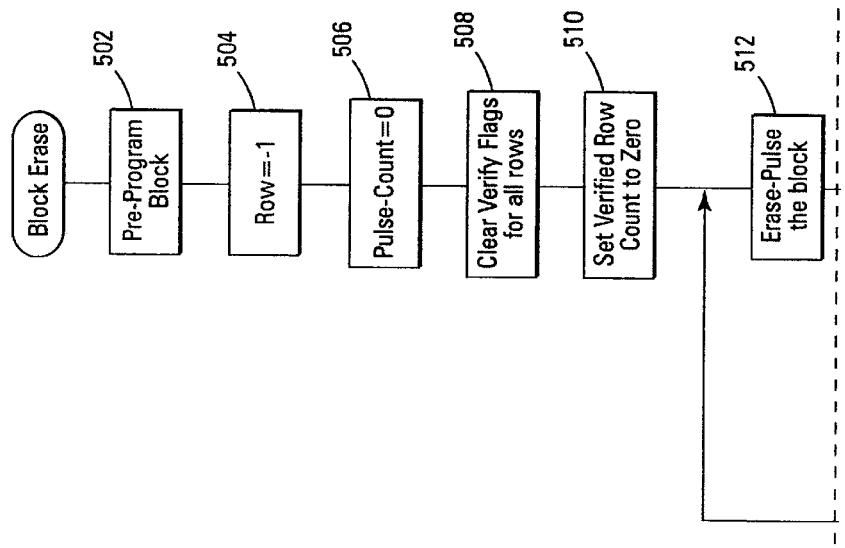
Figure 5B:
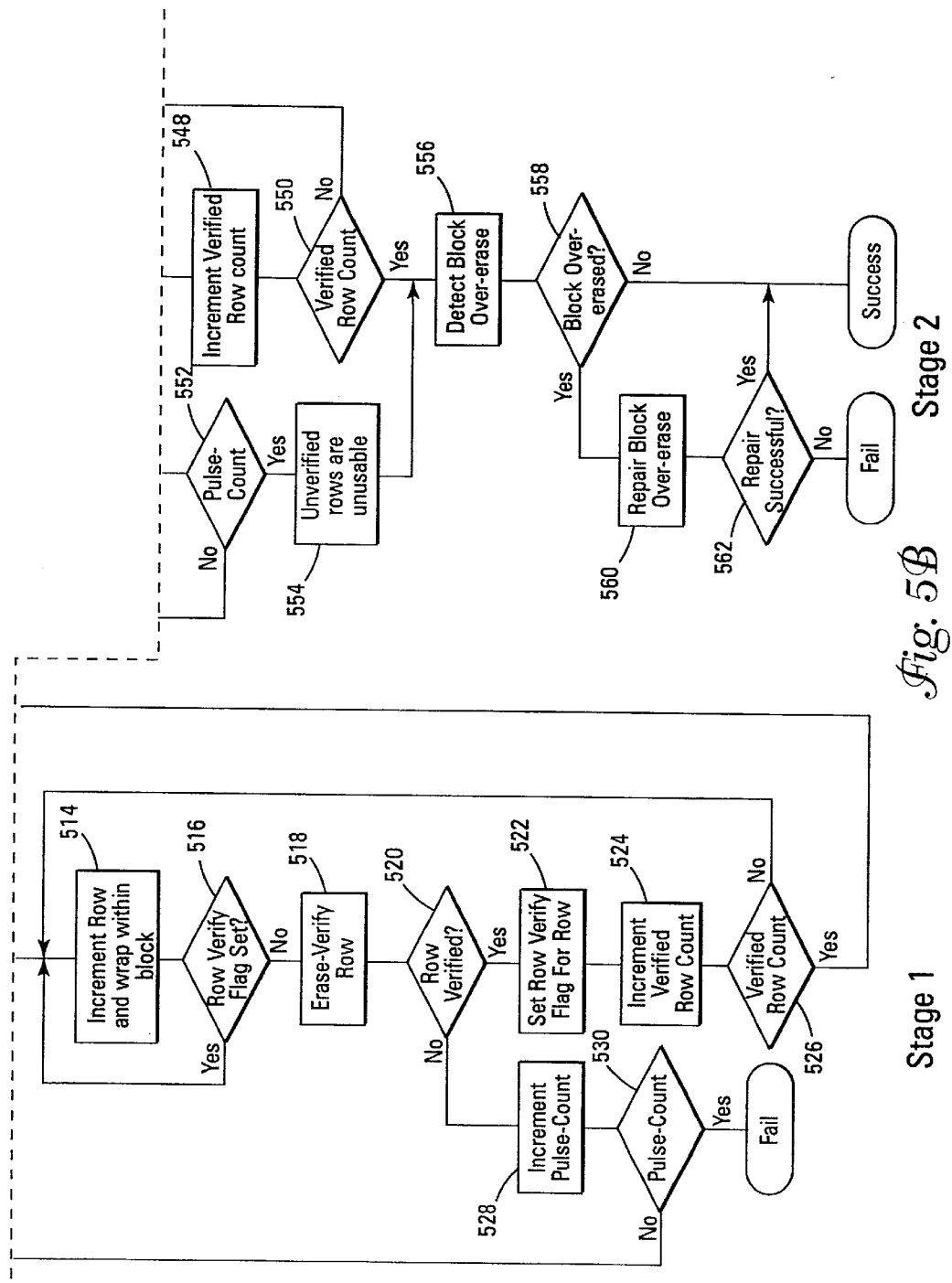

Referring to FIG. 5, a flow chart of an erase algorithm 500 of one embodiment of the present invention is illustrated. As illustrated, this algorithm is illustrated as having a first stage and a second stage. The first stage tracks the number of pulses needed to erase the predetermined number of rows and uses the registers to flag the rows that are verified as being erased. The second stage calculates and applies a maximum predetermined number of erase pulses to the block in trying to erase the rows not verified as being erased in the first stage.

The first stage begins by pre-programming the cells in the block to a predetermined level (502). An address counter of the rows in the block is set to minus one (504). The pulse count is set to zero (506), all verify flags are cleared (508) in an associated register and a verified row count is set to zero (510). An erase pulse is then applied to the block (512). The row is then incremented (if the row has reached its maximum, the row address starts over at a first row) (514). The register is then checked to determine if the current addressed row has already been flagged as being erased (516).

If the row has been previously flagged as being erased (516), the row is incremented (514) and the algorithm continues. If the row has not been previously flagged as being erased, the cells in the row are then verified to determine if they are all erased (518). If they are all erased, a flag is set in the register associated with the row, the row is then incremented (514) and the algorithm continues. If the row is not verified as being erased, the pulse count is incremented (528). The pulse count is then verified if it has reached a maximum (503). If the pulse count has reached a maximum, block erase of the current row has failed. If however, the pulse count is not at a maximum, an erase pulse is applied to the block (512) and the algorithm continues. If the row is verified that all the cells in the row have been erased (520), the row is flagged in an associated register (522). The row count of verified rows is then incremented (524). The row count of verified rows is then verified if it has reached the predetermined amount of verified rows (526). If the row count of verified rows has not reached the predetermined amount, the row is incremented (512) and the algorithm continues. If the row count of verified rows has reached the predetermined amount, the algorithm starts the second stage.

As illustrated, the second stage is started by applying a predetermined equation to the pulse count of the first stage to determine a maximum erase pulse limit to be applied to the block in trying to erase the cells in rows that were not verified as being erased in the first stage (532). The row is then incremented (if the row has reached its maximum, the row address starts over at the first row) (536). An associated register is then verified if it has been flagged as indicating the row has been erased (538). If the register has been flagged (538), the row is incremented (536) and the algorithm continues. If the register has not been flagged (538), the program state of each cell in the associated row is read (540). The row is then verified if all the cells have been erased (542).

If the row is not verified as being erased (542), the pulse count is incremented (544). The pulse count is then verified to see if it is at the pulse limit as set by the predetermined equation (552). If the pulse count is not at the pulse count limit (552), an erase pulse is applied to the block (534) and the algorithm continues. If the pulse count is at the pulse count limit (552), the unverified rows are unusable (554).

If the row is verified as being erased (542), a row verify flag is set in an associated register (546). The verified row count is then incremented (548). The row count is then verified to determine if all the rows have been flagged as being erased (550). If not all the rows have been verified as being erased (550), the row address is incremented (536) and the algorithm continues. If, however, all the rows have been verified as being erased (556), the columns of the block are monitored to determine if the block has any over-erased cells (556). The block is then verified for over-erased cells (558).

If it is verified that there are no over-erased cells in the block (558), the block has successfully been erased. If, however, it is verified that there are over-erased cells in the block (558), a soft-program is applied to the block to recover the over-erased cells (560). The block is then verified if the soft program was successful in recovering the over-erased cells (562). If the soft program was successful (562), the block has been successfully erased. If, however, the soft program was not successful (562), the block will have rows with over-erased cells and the controller or control circuitry will ignore these rows during other operations to the block of memory.

Conclusion

A method and apparatus for erase operations of a flash memory block is disclosed. In one embodiment, a method comprises erasing a predetermined percent of rows in a memory block, analyzing a number of erase pulses used to erase the predetermined percent and calculating an acceptable number of additional erase pulses which could be applied to the memory block to erase the remaining rows. In another embodiment, a flash memory device comprises a memory array, a controller and a register. The memory array has a plurality of blocks of flash memory cells. The memory cells in each block are arranged in rows. The controller is used to control memory operations to the memory array and the register is coupled to the controller to track the erase status of each row of memory cells.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a flash memory comprising:

erasing a predetermined percent of rows in a memory block;

analyzing a number of erase pulses used to erase the predetermined percent; and calculating an acceptable number of additional erase pulses which could be applied to the memory block;

applying the number of additional erase pulses to the memory block to erase rows not previously erased; and labeling rows not erased in the memory block for use during subsequent memory operations to the memory block that includes programming and reading operations.

2. A non-volatile memory device comprising:

a memory block having a plurality of erasable memory cells that are arranged in rows;

a controller coupled to the memory block such that the controller is able to erase a predetermined percent of rows of the memory block, determine a quantity of erase pulses to erase the predetermined percent of rows, and calculate a quantity of additional erase pulses needed to erase a remainder of the plurality of erasable memory cells not in the predetermined percent of rows of the memory block; and a register array coupled to the controller that stores data to track which rows of the memory block are erased for use during subsequent memory operations that include programming and reading operations.

3. The non-volatile memory device of claim 2 wherein the register array is part of the memory block.

4. The non-volatile memory device of claim 2 wherein the register array is comprised of non-volatile memory cells.

5. A flash memory system comprising:

a processor that generates erase signals; and a flash memory device coupled to the processor, the flash memory device comprising:

a memory block having a plurality of erasable memory cells that are arranged in rows;

a controller coupled to the memory block such that the controller, in response to the erase signals, is able to erase a predetermined percent of rows of the memory block, determine a quantity of erase pulses to erase the predetermined percent of rows, and calculate a quantity of additional erase pulses needed to erase a remainder of the plurality of erasable memory cells not in the predetermined percent of rows of the memory block; and a register array coupled to the controller that stores data to track which rows of the memory block are erased for use during subsequent memory operations that include programming and reading operations.

* * * * *